United States Patent [19]
Keeler et al.

[11] Patent Number: 4,996,477
[45] Date of Patent: Feb. 26, 1991

[54] APPARATUS AND METHOD FOR TESTING ELECTRICALLY CONTROLLED MOTOR

[75] Inventors: Randall W. Keeler; James L. King, both of Troy, Ohio

[73] Assignee: A.O. Smith Corporation, Milwaukee, Wis.

[21] Appl. No.: 427,795

[22] Filed: Oct. 26, 1989

[51] Int. Cl.$^5$ .................... G01R 15/00; G01R 15/12
[52] U.S. Cl. .................... 324/158 MG; 324/158 R; 324/73.1; 318/490
[58] Field of Search .................. 324/158 R, 158 MG; 318/490, 690, 696; 340/648; 322/99

[56] References Cited
U.S. PATENT DOCUMENTS

| | | | |
|---|---|---|---|
| 3,705,352 | 12/1972 | Restivo | 324/158 MG |
| 4,251,759 | 2/1981 | Boldt | 318/490 |
| 4,377,784 | 3/1983 | Saito et al. | 324/158 MG |
| 4,379,990 | 4/1983 | Sievers et al. | 322/99 |
| 4,727,320 | 2/1988 | Brennan | 324/158 MG |
| 4,743,848 | 5/1988 | Krimm et al. | 324/158 MG |
| 4,744,041 | 5/1988 | Strunk et al. | 318/490 |
| 4,808,865 | 2/1989 | King | 340/648 |

Primary Examiner—Reinhard J. Eisenzopf
Assistant Examiner—Vinh P. Nguyen
Attorney, Agent, or Firm—Andrus, Sceales, Starke et al.

[57] ABSTRACT

An on-site test unit is for an electric motor having an electronic timer having motor control contacts and a parallel capacitor completing a power connection with the opposite power connection being common. The test unit includes a portable housing with a fused power cable and an output connector. A switch, with a parallel test lamp, connects the power cable to connector output terminals. An internal test load lamp in parallel with a capacitor is connected in series to a control terminal and to a power terminal. A selection switch selectively supplies power to the terminals. For testing, the normal power supply is disconnected and the common connection to the motor and timer is opened. The connector may include a plurality of leads with terminal clips or releasable plug-in connectors in the motor and test unit. A dummy connector provides normal motor operation. In a motor test, the motor is connected by the selection switch to the power switch and cable. If the motor is inoperative and the power lamp lit, the motor needs repair. Momentary turn-on of the lamp indicates opening of the fused cable and a short-to-ground condition. In the timer position, power is connected to the timer and to the test lamp in series with the timer contacts, lights the test lamp if operative.

26 Claims, 2 Drawing Sheets

APPARATUS AND METHOD FOR TESTING ELECTRICALLY CONTROLLED MOTOR

BACKGROUND OF THE PRESENT INVENTION

This invention relates to a method and apparatus for testing electrically controlled electric motors and particularly to such an apparatus for onsite testing of such motors.

With the development of electronic controls, many electric motors are presently constructed with integrated on-site electronic controls for controlling the operation and operational state of an electric motor. A typical example developed by the assignee of this invention is a motor-pump unit forming a part of jetted water system such as present in a spa, whirlpool tub and the like. The motor is desirably controlled through a pneumatic actuator located at the tub for purposes of optimizing safety from electrical hazards by the operator. Various electronic timers, water pressure and level controls may be incorporated into the more sophisticated jetted tub devices. A particularly satisfactory control system incorporating an electronic control is disclosed in the co-pending application of James L. King, entitled "Electric Motors Having Integrated Control Housing And Method Of Fabrication" which was filed on Feb. 6, 1989 with Ser. No., 07/306,887. As more fully disclosed in the above application, the motor is constructed with a separate control chamber within which various control components including an electronic control can be mounted and wherein a power supply cable is connected to the motor through a separate interconnecting jumper cable to permit the direct energization of the motor in the event there is a system failure. This permits onsite determination of whether the motor has or has not failed, and by interference whether a failure arose within the electronic control. If the electronic control failure is implied by motor operation, the control can be removed and returned to a service station, thereby avoiding the necessity of removing the motor-pump unit. There is a distinct advantage both from a standpoint of cost and convenience to the customer provided by the above system. However, such system requires a special cable connection which is well justified in view of the alternate prior art mode of operation. However, the system does not permit separate on-site testing of the control, short conditions and the like. The electronic control is often provided with various protective systems but still constitutes a particular source of possible system failure and/or malfunction. There is a remaining need for a test system which can be applied to a conventionally connected electric motor with an electronic control to separately detect a fault location in the motor or the control.

In a conventionally connected electric motor, a circuit terminal board is provided within the motor. The terminal board includes an appropriate power terminal connected to the incoming power lines for parallel connection to the motor and the control in combination with at least one additional terminal for selective interconnection of control output of the electronic control into circuit with the power supply connection and the motor. Thus for example, in a typical jetted pump supply, a power terminal circuit board is provided including first and second power terminals for direct connection to the incoming power supply, with one terminal connected to the motor and timer. Additional terminals interconnect the power supply to an electronic timer having an output switch connected at the terminal board to the motor to establish a time controlled energization of the motor.

A non-operative or malfunctioning electronically controlled motor will generally be related to one of the six following basic faults: (1) motor failure, (2) electronic control failure, (3) motor and control failure, (4) power supply failure, (5) motor with a short-to-ground and operating under a hazardous condition, and (6) controller shorted-to-ground operating under a hazardous condition. Thus, even if the motor should check out as not operating properly, there is no assurance that the control, in fact, is the source of the fault. When the operator or service personnel is called to service the motor, the motor is disconnected from the power supply. The timer and motor connection to the power supply is also opened. If the motor operates, the fault is within the timer control. The timer control is removed and returned for servicing at the service shop, as previously noted.

Various fault conditions may however exist and it would be well if the service personnel could provide a direct on-site monitor and check of the input and output state of the electronic control such as an electric timer having output contacts controlling the energization of the motor.

There is therefore a need for a simple, effective and low-cost testing apparatus for on-site testing of both the motor and the separate control to determine precisely if either or both units are malfunctioning.

SUMMARY OF THE PRESENT INVENTION

The present invention provides an on-site motor testing apparatus and method for separately testing and detecting any malfunction of an electrically controlled motor including separate testing of the motor and the control unit. Generally in accordance with the present invention, the testing unit or device of the present invention includes a manual portable support structure for use by service and other personnel. The portable unit includes a power supply cable or input and an output releasable connector for interconnection to the motor and control unit. The test unit includes an internal circuit including switch means interconnnecting the power supply and a test load unit or device to the releasable connector. The switch means selectively supplies power to motor connectors or terminals within the releasable connector and to a control unit connector or terminals within the releasable connector. For testing purposes, the motor is disconnected from the normal power supply and connected to the test releasable connector and thereby to the appropriate inputs to the motor and in sequence to the control unit, with the internal test load connected in series with the output unit of the control unit. The test unit selectively supplies power to the motor terminals and alternately to the control terminals of the releasable connector. Separate monitoring and testing of the motor and the control unit are established. If both elements check out to be in proper operating condition, the personnel will then check the incoming power supply system for any external control fault condition.

In a preferred construction of the present invention, the test power supply includes a power switch. A sensible indicator, such as a lamp, a digital counter or the like, is connected in parallel with the power switch to the downstream or tester side of the power switch. The power cable and connection to the power switch includes a current responsive switch unit or means to operatively open the circuit response to a short condition across the power supply. In the test procedure, the connectors are connected to the appropriate motor or control unit. The power switch is turned on and provides power to the selected motor or control unit with the sensible output unit providing a signal of power on. If there is a short-to-ground in the unit under test, the power circuit effectively opens and turns-off the sensible indicator, thereby providing an additional fault state indication.

In addition, the load unit of the test unit is preferably a sensible output unit thus providing a direct indication of the normal operation of the control unit if an appropriate sensible output is created.

The releasable connector may include a simple plurality of appropriate leads with manually operated connectors or terminals such as terminal clips or the like. In a preferred construction for manufacture of a motor line, a releasable connector unit is provided including a motor mounted connector to the motor circuit and a releasable test complementing connector for connection to the motor mounted connector. A dummy connector or switch unit is provided for connection to the fixed motor connector to establish normal motor operation with connection of the normal incoming power supply.

In a particular practical construction for spas, whirlpool devices and the like, the motor is provided with a controller including a timer. The output of the timer controls a set contact connected between the motor and the incoming power supply, with a parallel capacitor to carry transient currents. A terminal board is provided having power terminals and control terminals. The one power terminal is connected directly to the motor winding and is adapted to be connected to the timer. The return side of the power supply is connected through a protective fuse unit in the motor winding to a common terminal on the terminal board which is connected to the return side of the timer. The terminal board includes a coupling timer unit connecting the one side of the motor winding to the timer contacts, which are also connected to the return side of the timer. In a releasable connector test system, a releasable connector having four terminals is provided including first and second terminals connected to open the common power connection between the motor and the timer. The first and second terminals of the releasable connector are connected to each by a dummy connector for normal operation to simultaneously connect power to the timer and to the motor. A third control terminal of the releasable connector is connected directly to the common connection between the motor and the output switch or contacts of the timer. The fourth terminal of the releasable connector is connected to the common return from the return side of the timer including the timer contacts. If the testing unit is formed with the releasable clips or other individual releasable connectors, the releasable connectors may of course be eliminated, in which event the motor and timer are connected in common to the main power terminal.

The test unit preferably includes a suitable portable housing including an input power cable adapted to be plugged into a conventional 115 volt supply and a four terminal releasable connector including four complementing terminals adapted to be releasably coupled to a motor mounted releasable connector. A double pole single throw switch connects the incoming power cable in series with a fuse to a lamp indicator connected to the timer side of the power switch, which is connected as the input to a test selection switch. The selection switch has a motor position and an alternate timer position. In the motor position, a set of motor contacts are connected respectively to two motor terminals of the connector. With the selection switch thrown to the motor position, the motor is directly connected across the power supply through the timer switch and the power switch. Operation of the motor is readily detected. If the motor does not operate and the power lamp is lit, the motor is bad and needs repair. If the motor should start running or the power lamp is illuminated momentarily and then turns off, the test fuse has been disrupted indicating a short-to-ground condition within the motor. The selection switch in the control or timer position connects power to a pair of timer contacts connected respectively to the timer terminals in the motor mounted connector. In addition, the timer includes a load lamp and a parallel capacitor connected between the power contact of the one control selection switch contact and the return contact of the motor contacts and through the corresponding terminal to the common connection between the motor and the output contacts of the timer. With the selection switch through to the timer position, the power is supplied directly across the timer to actuate the timer to close the timer switch or contacts. When the contacts close, the test lamp is connected as a load between the power supply terminal and the lamp in series with the timer output contacts. If the lamp is illuminated or turns on, the contacts are closed and the timer is operated properly. The capacitor in parallel with the lamp serves to carry transient currents carried by the capacitor in parallel with the contacts thereby essentially preventing erroneous functioning of the circuit. By monitoring the time that the lamp is turned on, the accuracy of the timer can be monitored.

In an alternate construction, simple releasable terminal units are connected directly between a single pole single throw timer switch. Three releasable units are required, two of which provide power connection to the power switch and the third of which interconnects to the one power line and the load unit for selective connection to the output contacts of the timer. In this mode, the common circuit power connection between the motor and the timer is open, and the releasable terminal units connected directly across the motor winding to monitor its state. Alternately, the power terminal units are connected directly across the timer to power the timer, and the control terminal unit is connected directly to the common connection between the motor and the timer contacts to connect the test lamp in series with the timer output contacts to the power supply and thereby monitoring of the timer. Again, with the test unit provided with the power switch and the parallel lamp and fuse circuit system, any short-to-ground condition will be detected.

The present invention thus provides a simple, readily constructed test unit which can be readily constructed with multiple releasable connectors for connection to existing electronically controlled motors and the like and which can also be integrated into the motor with releasable connectors for selective connection to a specially fabricated or adapted motor structure. All components and assembly requires only readily available and well known components and fabrication techniques. The operation of the system will also be readily understood by those normally concerned with motor servicing and fabrication.

Although described particularly with respect to the testing of completed motor structures for servicing and the like, the test unit can be readily applied to fabrication lines for testing motors as they are produced and prior to shipping for use.

BRIEF DESCRIPTION OF THE DRAWINGS

The drawings furnished herewith generally illustrate a best mode presently contemplated for carrying out the invention and are described hereinafter.

In the drawings.

DESCRIPTION OF THE ILLUSTRATED EMBODIMENT

Figure 1:
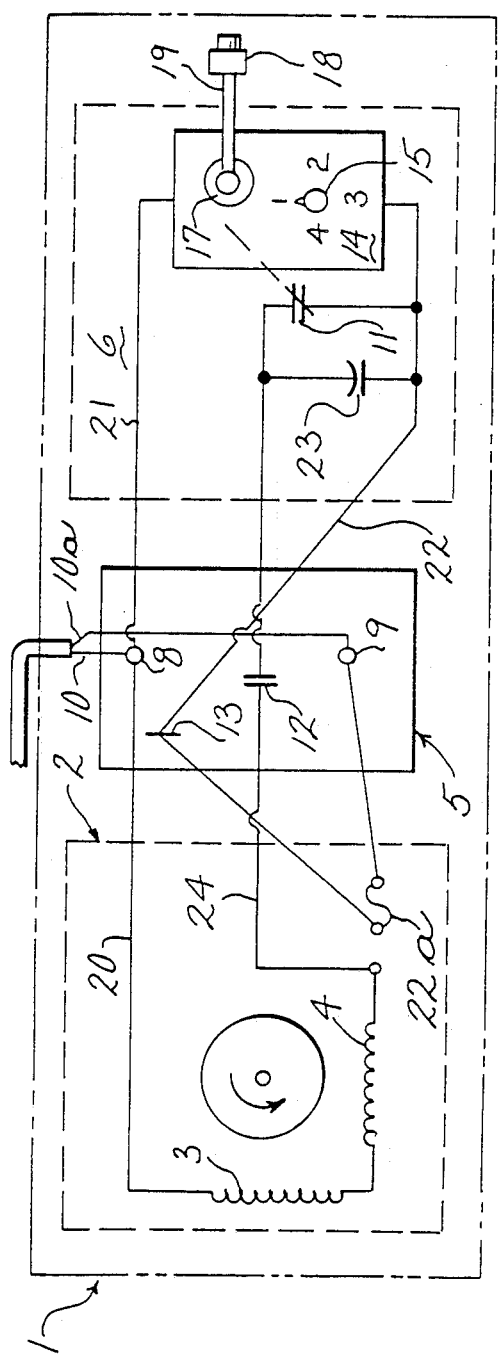
FIG. 1 is a schematic illustration of a rotary electric motor and an integrated electronic timer connected to a power supply.

Referring to the drawings and particularly to FIG. 1, a typical split-phase alternating current motor 1 is illustrated such as incorporated in a motor-pump unit. The motor 1 including a split-phase winding 2 with one phase 3 offset with respect to a second phase 4 for well known split phase operation. The motor 1 is connected to a conventional 115 volt power supply through a terminal board 5. An electronic controller 6, is connected in circuit with the motor winding 2 and an incoming power cable 7 at the terminal board 5. Thus, the electronic controller 6 is incorporated as an integrated part of the motor, and preferably mounted immediately at the motor to form an integrated unit, such as generally disclosed in the previously identified co-pending application of James L. King. The terminal board 5 is shown as a well known unit including a first power terminal 8 and a second power terminal 9 connected respectively to the incoming power lines 10 and 10a of cable 7 through suitable, releasable connectors, such as a threaded securement bolts. Control terminals 12 and 13 on the terminal board 5 are connected to the motor winding 2 and to the control timer 6 and particularly to interconnect an output switch unit or contacts 11 of a timer 14 into circuit to the one side of the motor winding 2.

In the illustrated embodiment of the invention, the controller 6 includes the timer 14, which can be preset to any desired operating time through a suitable rotary dial unit 15 or other preset input unit. The timer 14 controls a set of normally open switch 11, or other power control unit, in the normal state and disconnects the motor 1 from the incoming power supply. A pneumatic input control 17 is provided for actuating of the timer 14 which closes switch 11 for the present period to complete the power supply circuit from the power cable 7 to the motor 1. The pneumatic control 17 can be provided directly at the motor 1, or, in accordance with preferred constructions, includes a remote control actuator 18, such as a push button pump coupled to the controller input 17 by a pneumatic tube 19. The structure of the controller, timer and pneumatic actuating systems are known and no further description thereof is given other than as necessary to describe the illustrated embodiment of the present invention.

The motor winding 2 and the timer 14 are both connected to power terminal 8 and thus to one side of the power cable 7 via the respective leads 20 and 21. A power return lead 22 from timer 14 is connected to the control terminal 13.

The control terminal 13 is also connected through a motor sensitive condition fuse 22a to the second power terminal 9 and thus to the power cable 7. Actuation of the pneumatic actuator 18 will actuate the input and start the timer 14. Current flows from cable 7 at terminal 8, through the timer 14, the control terminal 13 and fuse 23 to the return terminal 9 and cable 7.

The timer contacts 11 are connected to return lead 22 of the timer 14 and the control terminal 12 on the terminal board 5. A small capacitor 23 is connected in parallel with the contacts 11. The capacitor 23 bypasses high frequency current, and establishes a circuit for high frequency transient signals, such as associated with opening and closing of the contacts 11.

The control terminal 12 is also connected via a lead 24 to the winding 4 of the motor winding. Thus, when the timer 14 closes its associated contacts 11, power is now supplied to the motor winding 2, from cable 7, the power terminal 8, through the winding 2 and the control terminal 12, the now-closed timer contacts 11 to the return line 22 of the timer 14, the contact terminal 13, fuse 22a, to the power terminal 9 and cable 7.

Thus, under normal operating conditions, the motor 1 operates under the control of the timer 14 in accordance with known circuit operation. If the motor 1 malfunctions for any reason or does not operate because of an open circuit in any connection, a service call is required. In accordance with the teaching of the present invention, the service personnel is provided with a test unit 25, one embodiment of which is shown schematically in FIG. 2.

In operation, the power cable 7 is disconnected from the terminal board 5 and controller 6 is disconnected from the terminal 8 at board 5 to isolate the motor winding 2 from the controller 6 and lead to fuse 22a is connected to terminal 13. The tester unit 25 is selectively connected to supply power to the motor 1 and to the controller 6 to separately check the operational state of the motor 1 and the controller 6.

Figure 2:
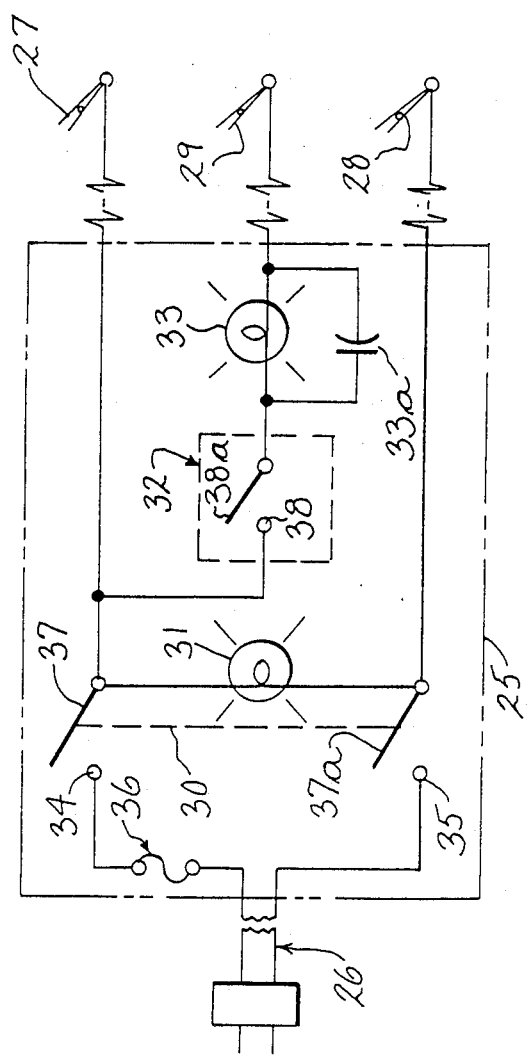
FIG. 2 is a schematic illustration of a test apparatus illustrating one preferred embodiment of the present invention and illustrating connection thereof into the motor circuit of FIG. 1 for purposes of independently monitoring the state of the motor and the electronic timer as shown in FIG. 1.

Referring to FIG. 2, the test unit 25 includes a power cable 26 for plug-in connection to a 115 volt power supply and a set of three terminal clips 27, 28 and 29 for selectively connecting of the test unit 25 to the motor winding 2 and the controller 6.

First and second clips 27 and 28 constitute power connecting terminals which are connected to the incoming test power cable 26 by a main power switch 30. A lamp 31 is connected across the open side of switch 30 and provides an indication of switch open and closed. The third clip 29 constitutes a timer connector connected to the main side of the incoming power cables by a motor/timer selection switch 32. A temporary load device, shown as an indicator lamp 33 in parallel with a capacitor 33a, is connected in series with selection switch 32 to the clip 29.

With the selection switch 32 set to motor test, the circuit to lamp 33 and clip 29 is open. The power clips 27 and 28 are connected to the main power line terminals 8 and 9 of the terminal board 5 and the power switch 30 is closed, providing power directly to the motor winding 2. If the motor 1 does not operate, a motor fault has been located.

With the selection switch 32 closed in the timer position, the clips 27 and 28 are connected to the power lines 21 and 22 to timer 14 to supply power to the timer 14. The timer clip 29 is connected to the output lead from the timer contacts 11 of the timer 14, and thereby connects load lamp 33 across the timer 14.

The power switch 30 is again closed. If the temporary load lamp 33 is energized, the timer 14 is operating normally. If not, the load lamp 33 is not be activated and an electronic circuit fault is detected as a result of the lamp 33 remaining off. If both tests check out properly, the fault is in the external power supply system or the like. The test of both motor 1 and controller 6 provides positive indication of the location of the fault or faults and provides the service personnel with the necessary information for most cost effective and efficient servicing of the motor pump unit.

More particularly in the illustrated embodiment of the invention, the power switch 30 is shown as a double pole, single throw switch having a normally open position. The switch 30 includes fixed contacts 34 and 35 shown connected to the incoming power test cable in series with a suitable fuse 36. The movable contact arms 37 and 37a are ganged for simultaneously positioning between the opened and closed position to contacts 34 and 35.

The indicating lamp 31 is shown connected directly across the movable contact arms 37 and 37a. When the switch 30 is closed and power is appropriately supplied, the lamp 31 is lit and indicates the test circuit is in condition for use.

The power clips 27 and 28 are connected directly to the movable contact arms 37 and 37a and thus are provided with power whenever the switch 30 is closed.

The selection switch 32 is shown as a single pole, single throw switch having a normal open position. Switch 32 has a fixed contact 38 connected to the positive power line and a movable contact arm 38a connected in series with lamp 33 to the timer clip 29. Capacitor 33a connected in parallel with the lamp corresponds to the capacitor 20 of the timer 14, and conducts corresponding transient current.

In summary, with the power cable 7 disconnected and the timer 14 disconnected from the timer board 5, the previously described circuit connections can be selectively established.

With the motor test connection, power is directly supplied to the motor winding 2. For the timer check, the clips 27 and 28 are disconnected from the power terminals 8 and 9 and connected to the timer leads 21 and 22. This establishes a circuit essentially simulating the motor load which is connected to the timer 14.

In the electronic circuit test position, the lamp 33 turns on if the timer 14 is functioning in the normal manner. In this mode, current flows through the incoming cable 26 to the power switch 30 in series with fuse 36. Current flow to the timer 14 is directly via the test clip 27 and 28 and the return line of the timer 14. If the timer 14 is operating properly, contacts 11 close.

The interconnection of the third clip 29 provides current from the top side of the illustrated power switch 30 through the now closed contacts 38 and 39 of selection switch 32, clip 29 and the timer indicator light 33 in parallel with the small 0.05 microfarad capacitor 33a, the timer relay contacts 11 to the main return line 22. The capacitor 33a in parallel with the lamp 33 serves to bypass stray currents produced as a result of the functioning of the filter capacitor 23 in the timer circuit.

The fused connection of the test unit 25 provided by fuse 36 protects the service personnel from abnormal current condition and also provide a direct indication of a direct short between the motor 1 or the controller 6 being tested and ground. Because of the direct short-to-ground fault detection, the fuse 36 avoids the necessity for a separate ground fault circuit or indicator while protecting against hazards associated with use of such a separate unit.

In the test of the motor 1, the main power switch lamp 31 will flash on and then off if a motor ground condition is present. Because of excessive current associated with a short, the fuse 36 will open shortly after closing of switch 30 and the lamp 31 turns off as a result of the ground condition. If such a condition is detected, the test device 25 should be removed and the motor 1 directly tested for the short or ground condition and appropriate action undertaken. The fuse 36 in the tester must of course be replaced.

Figure 4:
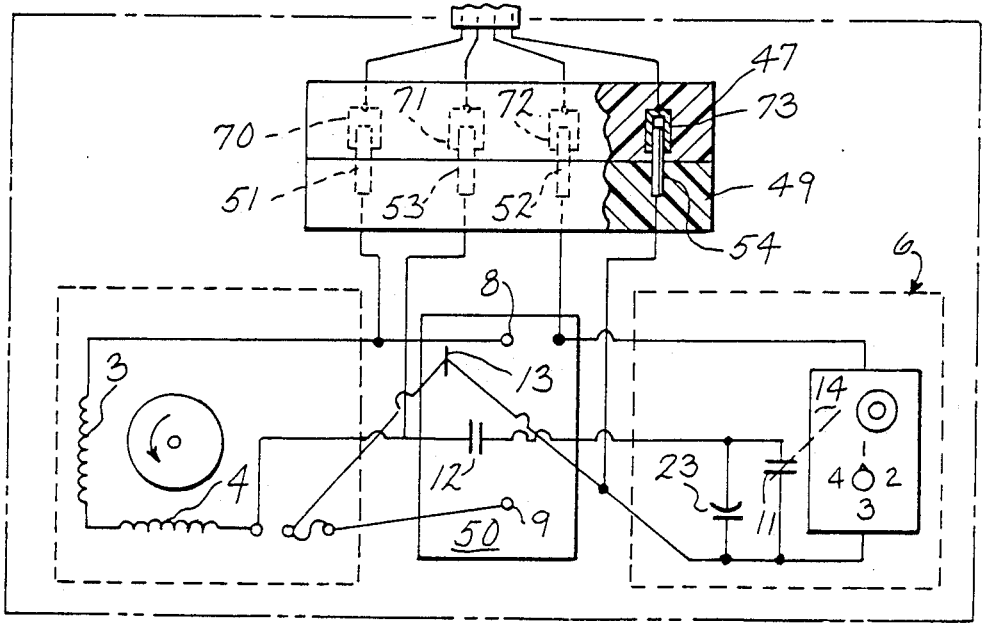
FIG. 4 is a view schematically showing a motor and a modified test unit incorporating a plug-in connector assembly for separately testing a motor and its electronic control.

The test unit may also be used in the fabrication of motors in a production system. The test unit is obviously adapted to be packaged as a relatively small and readily portable device which can be conveniently transported and used by service personnel to precisely analyze and locate the location of the fault, and thereby provide the necessary servicing in an effective procedure, such as shown in FIG. 4, and more fully described hereinafter.

The separate unit using clip connectors 27–29 for elective interconnection to the motor and controller 6 provides a satisfactory system particularly adapted for testing existing motor units.

Figure 5:
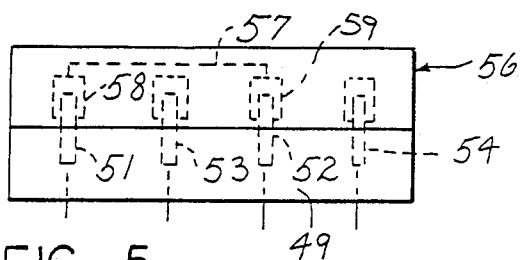
FIG. 5 is a fragmentary view illustrating the motor connection for the motor of FIG. 4 for use in the field.

The test system is also conveniently constructed with plug-in connectors provided on the motor and the tester unit. An embodiment of a plug-in system including multiple terminal connectors for supplying power to the motor and the timer is shown in FIGS. 3–5.

The tester 39 includes an outer test housing 40 including a conventional plug-in cable 41 having a suitable grounded three prong plug 42 for coupling to a conventional wall socket. A main power lamp 43 for indicating the actuation of the power switch is mounted to the housing 40. The power switch is illustrated having a rocker arm 44 positioned between off and on, with lamp 43 mounted behind the arm 44. In addition, selection switch is shown having a simple toggle lever 45 mounted to the housing 40 and having a check timer position and a check motor position. The timer load lamp 46 is located immediately adjacent to the toggle lever 45 for providing visual indication of the status thereof, as previously and hereinafter described.

Figure 3:
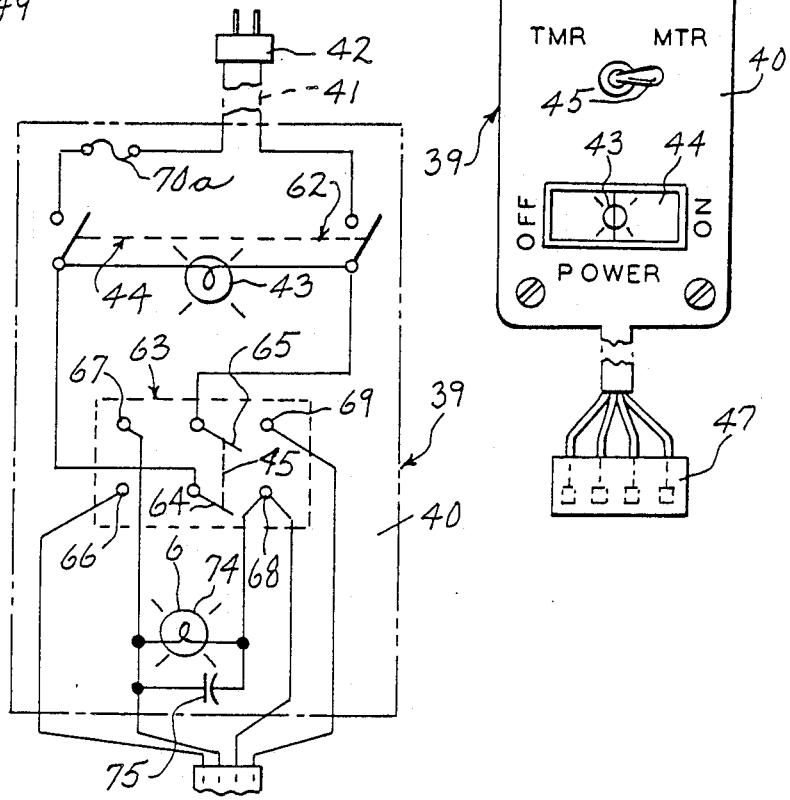
FIG. 3 is an elevational view of a motor controller test unit with a plug-in releasable connector for coupling to a motor having a complementing connector.

Referring further to FIGS. 3 and 4, a four terminal plug connector 47 is interconnected to the test housing 40 for selective connection to the motor and controller 6. The motor 48 includes a complementing connector plug 49 connected in circuit with the motor 1, controller 6 and the terminal board 5. The plug connector 49 includes four terminals 51, 52, 53 and 54 connected respectively to the four leads from the terminal board 50 to the motor 1 and the timer 14 of controller 6, as follows. In particular, terminals 51 and 52 are connected respectively to the main power terminal 8 and to timer 14. Terminals 53 and 54 are connected to leads to terminals 12 and 13. Terminals 51 and 52 must be connected to complete the controller circuit.

For normal motor operation, a dummy jumper plug 56 having a jumper lead 57 is inserted into the plug connector 49 and completes the normal operating power connection. Jumper lead 57 includes terminals 58 and 59 aligned with the terminals 51 and 52 to complete the power connection to timer 14.

The complementing terminals such as terminals 51 and 58 are respectively receptacles and complementing pins in the illustrated embodiment. In plug connector 56, the terminal locations aligned with terminals 53 and 54 of plug connector 49 are blank. When the jumper connector plug 56 is removed, an open circuit is established to the power terminal 8, and creates the necessary open circuit between the motor and controller 6 to isolate the motor circuit from the control circuit for testing, similar to the removal of the timer lead from the terminal 8 of board 5 in the first embodiment of the test unit. Testing of the motor and controller is made by insertion of plug connector 47 into plug connector 49, after the main power connections are removed from the power terminal 8 at the terminal board 5 in the same manner as described with respect to the first embodiment such that power is only supplied via the power cable 41.

The test circuit is modified slightly to provide for appropriate connection to the motor circuit and to the timer 14 without the necessity of the selective connection of the leads from terminal 13 to terminal 12 as with manual connector clips 27-29 of the first embodiment.

Referring particularly to FIG. 4, a power switch 62 is identically constructed to switch 3 of FIG. 2 and connected into circuit to the incoming test power cable 41 and with the corresponding output lines for interconnection to the motor winding 2 and to the timer 14 through a modified selection switch 63.

The selection switch 63 of the plug-in tester is a double-pole double-throw switch. The movable switch arms 64 and 65 are ganged to toggle lever 45 and pivoted in one direction to the motor position, and oppositely pivoted to the test position. Actuating of the arm 64 and 65 to the motor position provides power to the motor windings 2 through the plug connectors 47 and 49. Conversely, pivoting of the lever and switch arms 64 and 65 to the timer position provides power to the timer 14 through the plug connectors 47 and 49.

The apparatus generally includes a motor test output unit and a controller test output unit. The two test output units may have certain common circuit connecting elements. In the embodiments of FIGS. 3-5, a plug-in unit is illustrated having the two output units formed in a common plug connector 47. One terminal of member 47 is common to both output units, as shown and now described.

Referring to the schematic circuit of FIG. 4, the switch contact arms 64 and 65 are pivoted arms connected to toggle lever 45, to alternately connect to fixed motor contacts 66 and 67 and fixed timer contacts 68 and 69. The motor contacts 66 and 67 of the switch include a main power line contact 66 aligned with the power contact arm 64 connected to the power switch 42. Return contact 67 is aligned with the return side contact arm 65 connected to switch 62. Contacts 66 and 67 are connected to the terminals 70 and 71 of the plug connector 47.

Terminals 70 and 71 of plug connector 47 form the motor test output unit of the test apparatus of the embodiment of FIG. 4. The terminals 70 and 71 provide power directly to windings 3 and 4 of motor winding 2, as follows. Terminals 70 and 71 are aligned with and engage terminals 51 and 53 of plug connector 49. Terminals 51 and 53 are connected respectively to motor winding 2 via terminal 8 and to the common lead connection to terminal 12 which is connected to the motor winding 2. Positioning of the selection switch 63 to the motor position thus directly connects the motor windings 3 and 4 across the power lines of cable 41 with current flow through a fuse 70, the bottomside of power switch 62, contacts 64 and 66 of switch 63, terminals 70 and 51 of plugs connectors 47 and 49, the motor windings 3 and 4, terminals 53 and 71 of plugs connectors 49 and 47, contacts 67 and 65 of switch 63 and contacts of switch 62 to the power cable 41. A circuit connection similar to that provided by the connection of the power clips 27 and 28 of the first embodiment is established.

The controller test output unit in FIG. 4 is integrated in the plug connector 47, and includes the terminal 71 of the motor test output unit and additional terminals 72 and 73 to provide power to controller 6. Terminal 71 is thus a common test connection used to separately test both the motor and the controller.

Contact 68 of the timer side of switch 63 is connected to the terminal 72 of plug connector 47. Terminal 72 is coupled to the power side terminal 52 of plug 49, which is connected to the timer for supplying power to the one side of the timer 14. The power contact 68 is also connected to a timer test lamp 74 in parallel with a small transient current capacitor 75, the opposite side of which is connected to terminal 71 of plug 47 and terminal 53 of plug 49; and thus to the return line for the motor circuit via the controller output including the timer relay contacts 11 and parallel capacitor 23 of the controller 6. The second test contact 69 of switch unit 63 is connected to terminal 73 of the plug 47. Terminal 73 is connected to terminal 54 of plug connector 49 which is connected directly to the return side to the timer 14.

The terminals 72 and 73 are thus connected directly to the power supply cable 41 via switch 63 and with the terminal 71 provide the controller test output unit to energize the controller 6 in circuit with the lamp 74 and the capacitor 75 as the load, as follows.

With the toggle selection switch 63 set to the controller test position and the rocker arm switch 62 turned to the on position, the power supply is directly connected to the timer 14 of the controller 6. Current flow is from the power cable 41 through power switch 62 to the center contact arm 65 of the selection switch 63. In the timer position, current is supplied to the power contact 69, terminals 73 and 54 of plug connectors 47 and 49 to the lower side of the timer 14, through timer 14, terminals 52 and 72 of the plug connectors 49 and 47 to the contacts 68 and 64 if selection switch 63 and via the switch 62 and fuse 70a to cable 41. In addition, the timer contact 68 of selection switch 63 establishes current flow through the timer test light 74 in parallel with capacitor 75 to the terminal 71 of plug 47, and via the engaged terminal 53 of plug connector 49, the controller contacts 11 and the capacitor 23 of the timer 14, terminals 54 and 73 of plug connectors 47 and 49 to the switches 63 and 62 to cable 41 to energize lamp 74 if the timer 14 is functioning properly.

Thus, with power supplied to the timer 14, the timer 14 should close the contacts 11 and complete the circuit to the timer indicator lamp 74 and the parallel capacitor, which in essence is the load connected in series with the timer contacts 11. The capacitor in the test unit again passes stray current produced by the capacitor in the timer.

In summary, the plug-in circuit system with the four terminal connectors 47 and 49 establishes selective connection of the test unit to test the motor 1 and the controller 6, as follows.

Power is disconnected from the main terminal board 5. Plug connector 56 is removed from the motor mounted plug 49. Test plug connector 47 is inserted into plug connector 49 to establish the circuit connection between the power cable 47, and selectively to the motor windings 2 and to the timer 14 through the operation of the test power switch 62 and the test selection switch 63. The control circuit is monitored with the power connected by inserting test power plug connector 42 into an appropriate power supply socket to establish 115 volt power supply to the system.

The motor test is established by setting of the selection switch 63 to the motor position. In this condition, the center power terminals of the double-throw double-pole switch connect power directly to the terminal 70 and 71 of the plug connector 47 and via terminals 51 and 53 directly across the motor winding 2 upon closing of the power switch 62 of the test unit. The test lamp 43 is illuminated and simultaneously if the motor is without fault, the motor is energized in precisely the manner disclosed with respect to the prior embodiment. If the motor windings 2 has an open circuit, the motor will not operate indicating a motor fault. If the motor has a short-to-ground, the switch lamp 43 will be on momentarily until the fuse 70a opens; thereby indicating the short-to-ground fault.

With selection switch 63 set to the timer test position, power is supplied to the timer 14 and to the test lamp 74 in series with the timer contacts 11 via the terminals 71, 72 and 73 of the plug 47 and the engaged terminals 53, 52 and 54 of plug 49. If the timer operates properly, lamp 74 is energized. If the timer has a short-to-ground, lamp 74 will be momentarily energized until fuse 70a opens.

In summary, the present test device and fault detector provides a separate self-contained test unit specially constructed to isolate the motor and the control circuit during the testing. A special display is provided to monitor the motor and the controller and the respective operation. The lamp 43 and 74, or other related sensible output units, detect the energized state of the motor and respectively control to indicate appropriate operation. By timing the on period of the test lamp 74, the accuracy of the timed cycle provided by the timer 14 can also be detected.

Although shown with special plug-in type connectors, any other suitable switching circuit system could be provided with proper termination within the motor to form an integrated system within the motor as such. The fault detection circuit could also be incorporated directly into the electronic control circuit with an appropriate isolating switch for disconnecting of the controller from the power supply in combination with the other necessary switches and connections to selectively supply power from a test unit to the controller and to the motor windings.

Although the plug-in unit and the allegator clip units are shown as a separate test unit, they obviously can be combined into a single test unit. Thus, the plug-in unit of FIGS. 3 and 4 can also be provided with the allegator clips in accordance with the interconnection of the system as shown in FIG. 2. If the fault is not obvious, the service personnel may automatically replace the electronic circuit board to insure the system operation, and may cause the consumer purchasing an unnecessary replacement part.

Further, the test can also be provided with a ground fault detector to determine if the motor or controller is grounded and creating an electrical hazard.

Although disclosed with a timer indicating lamp and with a pneumatic actuator and associated switch, other forms of display and switching controls can of course be provided. Thus, if a timer is used, a counter with a numerical display can be provided. These and similar components of the system may be readily modified and replaced to provide corresponding control functions.

The controller may of course include other contacts other than a timer control to control the connection state of the motor to the power supply. A control circuit arrangement may, for example, be provided for controlled energization of variable speed motors, permanent magnetic motors, and various recent variable and switched reluctance motors and the like.

The present invention thus provides a practical, reliable and cost effective method for not only monitoring the fault state of a motor but also of the usual controls including an electronic printed circuit board which has created particular problems in the industry.

The fault detector apparatus is readily formed as a small compact unit using present day technology and can be readily formed as a separate manually connected unit with releasable connectors as an integrated part of the control system. The invention permits the servicing of existing motors as well as incorporation as an integrated part of a new motor line for improved servicing of system malfunction in a minimum time and at a minimum cost.

Various modes of carrying out the invention are contemplated as being within the scope of the following claims particularly pointing out and distinctly claiming the subject matter which is regarded as the invention.

We claim:

1. A portable test unit for a motor unit having an electric motor in combination with a separate controller said controller having a control output unit for controlling the power supply connection to said motor, said portable test unit having a separate test power supply and a selection switch unit having a first switch position connecting said test power supply to a motor test output unit and having a second switch position connecting said test power supply to a controller test output unit, and a connection unit for connecting of said motor test output unit to said motor and for connecting said controller test output unit to said controller to selectively and separately monitor and provide power from said test power supply to said motor in said first switch position and in said second switch position to said controller to selectively and separately monitor the state of said motor and said controller through the position of said selection switch unit, said test unit including a load unit connected to said connection unit and connecting a load in series circuit with said controller test output unit.

2. The portable test unit of claim 1, wherein said connection unit includes a first releasable connector unit in said motor, said first releasable connector unit having a first and second terminal connected to said motor winding and to said controller and having a third terminal connected to a common return line and a fourth terminal connected to the control output unit of said controller, said test unit includes a complementing releasable connector having first, second and third test terminals selectively connected to said test power supply and having a fourth terminals connected to the output unit of said controller, and said load unit connected between said fourth terminal and said third test terminal.

3. The portable test unit of claim 2, having a power switch connecting said test power supply to said selection switch unit for selectively connecting said test power supply to said complementing releasable connector, and a power indicator in parallel with said power switch.

4. The portable test unit of claim 3, wherein said selection switch unit is a double pole double throw switch unit having a first set of motor contacts and a second set of controller contacts and movable contacts selectively engaged with first and second sets of contacts, said movable contacts being connected to said power switch, said motor contacts being connected to said first and second test terminals, and said test contacts being connected to said third and fourth test terminals.

5. The portable test unit of claim 4, including a current responsive switch unit connected between the test power supply and said power switch, said current responsive switch unit opening in response to a short-to-ground current to said motor or said controller whereby said power indicator operates between the closing of the power switch and the opening of said current responsive switch unit.

6. The portable test unit of claim 1, wherein said controller includes a timer controlling a set of contacts forming said control output unit, said load unit includes a visual display establishing a visual indication of the timer operation.

7. The portable test unit of claim 6, having a switch connecting said test power supply to said selection switch unit for selectively connecting said test power supply to said complementing releasable connector, and a power indicator in parallel with said power switch, a current responsive switch unit connected between the test power supply and said power switch, said current responsive switch unit opening in response to a short-to-ground current to said motor or said controller whereby said power indicator operates between the closing of the power switch and the opening of said switch unit.

8. A motor test apparatus for monitoring an electronically controlled motor including an electronic control unit having a powered input for connecting to a power supply in parallel with the motor and having a control output unit connected to separately control the connection of the power supply to said motor and thereby control the operating state of said motor, said motor test apparatus comprising a separate power test supply adapted to supply power to said motor and to supply power to said electronic control unit for independent and separate operation thereof, a load unit adapted to be connected to said electronic control unit to simulate connection of said motor to said electronic control unit, test power connector means for selectively connecting of said separate test power supply to said motor to actuate said motor and to said electronic control unit to alternately actuate said electronic control unit, and a third connector means for connecting of said load unit in circuit with said control output unit of said electronic control unit to said power test supply.

9. The apparatus of claim 8, wherein said load unit includes a sensible output signal device for providing a sensible output signal to the user of the operating status of said electronic control unit.

10. The apparatus of claim 8, wherein said control output unit includes a switch means and a parallel transient current capacitor, and said load unit includes a lamp and a parallel transient current capacitor.

11. The motor test unit of claim 8, including a test power switch connected in said power test supply, a fuse unit connected in series with said power switch, a sensible indicator connected in parallel with said power switch and in series with said fuse unit.

12. The motor test unit of claim 8, wherein said third connector means includes a selection switch connected to said load unit and said power switch to supply power to one side of said load.

13. The motor test unit of claim 8, wherein said test power supply includes a power cable having first and second power leads and including a power connector plug for connection to a power distribution receptacle, a fuse unit, a power switch connected in series with said fuse unit to said power cable, first and second test leads connected to said power switch for supplying power to said motor or said control unit, a selection switch, a test lamp, a third test lead connected to one of said power leads in series with said test lamp and said selection switch, said test leads each including a manually releasable connector unit for selectively connecting said leads to said motor and to said control unit.

14. The motor test unit of claim 13, including a capacitor connected in parallel with said test lamp.

15. The apparatus of claim 8, including a sensible output unit connected in parallel with said test power supply and establishing a sensible output in response to conduction of power from said test power supply, and a current responsive switch unit connected to said power supply and said sensible output unit to operatively disconnect the power supply and thereby deactivate said sensible output unit in response to a short condition connected across said power supply by said motor or by said electronic control unit to thereby momentarily actuate said sensible unit and provide a short indicator.

16. The apparatus of claim 15, wherein said current responsive switch unit includes a fuse.

17. The apparatus of claim 8, including a releasable plug assembly including a first plug member mounted to said motor and connected to said motor and said electronic control unit and to the incoming power supply, said first plug member including first and second circuit connectors connected to said motor and said electronic control for supply power thereto, said plug member having a third circuit connector connected to said control output unit of said electronic control unit and to said motor and a fourth circuit connector connected to a common return line connected to said control output unit, said motor test apparatus including a complementary plug member having connectors complementing said first plug member, said complementing plug member having first and second power connectors aligned with said first and second circuit connectors, said complementing plug member having a third releasable connector aligned with said third circuit connector and a fourth releasable connector aligned with said fourth circuit connector, and said load unit being connected between said second releasable connector and said third releasable connector.

18. The apparatus of claim 17, including a power cable including a fuse responsive to abnormal current flow, a power switch connected to said cable and including a lamp indicator connected in parallel with the test side of said power switch, a selection switch unit including contacts connected to said power switch and movable into engagement with test timer contacts and alternately with test motor contacts, said test motor contacts being connected to the first releasable connector of said releasable plug member and to the fourth releasable connector, said test timer contacts being connected to said second and third releasable connectors, and a load unit including a sensible output unit connected between the second and the fourth releasable connectors and thereby establishing a circuit from the test power cable through said load circuit in series with said control output unit to monitor the operating status of said control unit and said output unit.

19. The apparatus of claim 17, including a test power cable, a fuse connected to said power cable, a power switch connected to said fuse and cable, said power switch connected to said releasable plug member, a sensible indicator connected to the output side of said switch for providing a sensible output upon closure of said power switch, a short-to-ground condition in the motor or control unit under test creating an abnormal current flow through the test cable fuse and thereby opening the power circuit to the power switch and de-energizing of said lamp, the energization and de-energization of said lamp providing a sensible output indicating the short-to-ground condition.

20. A motor fault unit for testing a motor having a controller selectively connecting said motor winding to an incoming power supply, said controller having an electrical operator for a controller connecting means between said motor winding and said power supply, comprising a separate power supply unit having a first line and a second line, a power switch unit having a first switch in said first line and a second switch in said second line, a power switch indicator energized with said switch closed, a control state indicator connected to said first line downstream of said power switch, a test connector including a first power connector and a second power connector and a control test connector connected to said control state indicator, and said test connector having first connection means connecting said first and second lines directly to said motor winding for operating said motor from said separate power supply unit, and said test connector having a second connection means connecting said first and second lines directly to said controller for energizing said operator and connecting said control state indicator in circuit with the first connecting means across said first and second lines for monitoring the state of said controller.

21. The motor fault test unit of claim 20, including a replaceable fuse unit in said power supply unit upstream of said power switch unit, and said power switch unit indicator has a visual output whereby said indicator is momentarily actuated in the presence of a short condition in said motor or in said controller.

22. The motor fault test unit of claim 20, wherein said control state indicator includes a lamp in parallel with a capacitor, said capacitor being operable to pass the transient signals of said controller.

23. The motor fault detector of claim 20, wherein first and second power connectors include a releasable connector unit for temporary connection to said motor and to said controller and operable to directly operate said motor and said operator of said controller, and including an operator connector including a releasable connector unit for connecting said control state indicator in a series circuit with said controller connecting means and with said series circuit in parallel with said operator.

24. A motor and a motor control unit test method for a motor and a control unit for controlling operation of said motor and having first power connection connected to said motor and to said control unit and a second power connection to said control unit and said control unit having a control output connecting the motor to said second power connection comprising establishing a separate test power supply unit for establishing an operating voltage for operating the motor and for operating the said control unit, opening the first power connection between the motor and said control unit to provide separate power connections to the motor and to the control unit, connecting said test power supply directly to said motor for direct testing the state of said motor, disconnecting the test power supply from said motor, connecting said test power supply to said separate power connection to said control unit and to said second connections to actuate said control unit, and connecting a load unit between said control output and said separate power connection to said control unit to simulate a motor load for testing said control unit.

25. The test method of claim 24, wherein said control output includes a contact connecting the motor to said second power connection, and said load unit is connected to said switch unit in common with said motor.

26. The test method of claim 25, wherein said control output includes a transient signal capacitor connected in parallel with said contact, and including forming said load with an inductive winding and a transient signal capacitor in parallel with said inductive winding.

* * * * *

UNITED STATES PATENT AND TRADEMARK OFFICE
CERTIFICATE OF CORRECTION

PATENT NO. : 4,996,477

DATED : February 26, 1991

INVENTOR(S) : RANDALL W. KEELER ET AL

It is certified that error appears in the above-identified patent and that said Letters Patent is hereby corrected as shown below:

Claim 1, column 12, line 51, after "controller" insert -- , --; Claim 7, column 13, line 46, before "switch" insert -- power --; Claim 11, column 14, line 18, delete "unit" and substitute therefor -- apparatus --; Claim 12, column 14, line 26, after "load" insert -- unit --; Claim 13, column 14, line 27, delete "unit" and substitute therefor -- apparatus --; Claim 13, column 14, line 27-28, delete "test power" and substitute therefor -- power test --; Claim 14, column 14, line 40, delete "unit" and substitute therefor -- apparatus --; Claim 17, column 14, line 61, delete "supply" and substitute therefor -- supplying --; Claim 17, column 14, line 66-67, delete "complementary" and substitute therefor -- complementing --;

UNITED STATES PATENT AND TRADEMARK OFFICE
CERTIFICATE OF CORRECTION

PATENT NO. : 4,996,477

DATED : February 26, 1991

INVENTOR(S) : RANDALL W. KEELER ET AL

It is certified that error appears in the above-identified patent and that said Letters Patent is hereby corrected as shown below:

Claim 21, column 16, line 8, after "switch" (second occurrence) delete "unit"; Claim 25, column 16, line 51, delete "switch unit" and substitute therefor -- contact --.

Signed and Sealed this

Twenty-fifth Day of August, 1992

Attest:

DOUGLAS B. COMER

*Attesting Officer*    *Acting Commissioner of Patents and Trademarks*